US006449758B1

United States Patent
Satoh et al.

(10) Patent No.: US 6,449,758 B1
(45) Date of Patent: Sep. 10, 2002

(54) APPARATUS FOR AND METHOD OF AUTOMATICALLY PLACING AND ROUTING

(75) Inventors: Takao Satoh, Tokyo (JP); Ryo Nakai, Hyogo (JP)

(73) Assignees: Mitsubishi Denki Kabushiki Kaisha, Tokyo (JP); Mitsubishi Electric System LSI Design Corporation, Itami (JP)

( * ) Notice: Subject to any disclaimer, the term of this patent is extended or adjusted under 35 U.S.C. 154(b) by 0 days.

(21) Appl. No.: 09/413,479

(22) Filed: Oct. 6, 1999

(30) Foreign Application Priority Data

Jun. 9, 1999 (JP) .............................. 11-162390

(51) Int. Cl.$^7$ .............................................. G06F 17/50
(52) U.S. Cl. ............................................................ 716/10
(58) Field of Search .......................... 716/11, 8, 9, 12, 716/10, 21

(56) References Cited

U.S. PATENT DOCUMENTS

| 5,871,874 A | * | 2/1999 | Tounai | 430/296 |
| 6,099,581 A | * | 8/2000 | Sakai | 716/11 |
| 6,137,901 A | * | 10/2000 | Harazaki | 382/144 |
| 6,298,473 B1 | * | 10/2001 | Ono et al. | 430/30 |
| 6,311,319 B1 | * | 10/2001 | Tu et al. | 430/22 |
| 6,335,981 B1 | * | 1/2002 | Harazaki | 382/144 |
| 6,340,542 B1 | * | 1/2002 | Inoue et al. | 430/5 |
| 6,370,441 B1 | * | 4/2002 | Ohnuma | 700/121 |

FOREIGN PATENT DOCUMENTS

| JP | 08-297692 A | 11/1996 |
| JP | 09-006831 A | 1/1997 |

* cited by examiner

*Primary Examiner*—John F. Niebling
*Assistant Examiner*—Stacy Whitmore
(74) *Attorney, Agent, or Firm*—Burns, Doane, Swecker & Mathis, LLP

(57) ABSTRACT

Cell assignment section performs an automatic cell assignment according to circuit data 51. Distribution path determining section automatically determines a distribution path between cells. Distribution information extracting section extracts information regarding already determined distribution path. Prescribed-information recognizing section recognizes information on a prescribed portion (end or bend) of the distribution. Additional-distribution-data generating section generates additional distribution data for correcting the width of the prescribed portion. Additional-distribution-data lay-out section lays out the generated additional distribution data for the prescribed portion. This makes it possible to quickly obtain final pattern data in a state of designing a mask that is used for manufacturing a semiconductor integrated circuit device.

8 Claims, 14 Drawing Sheets

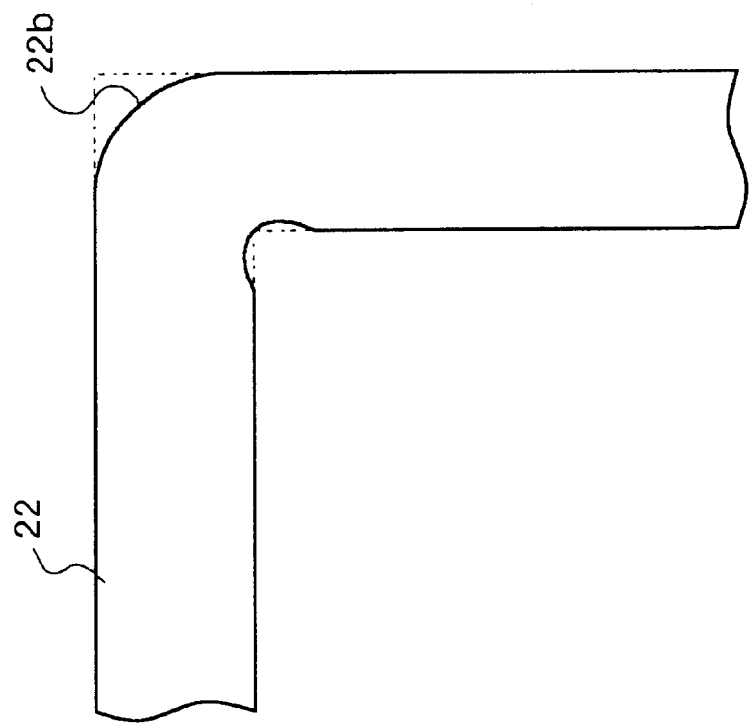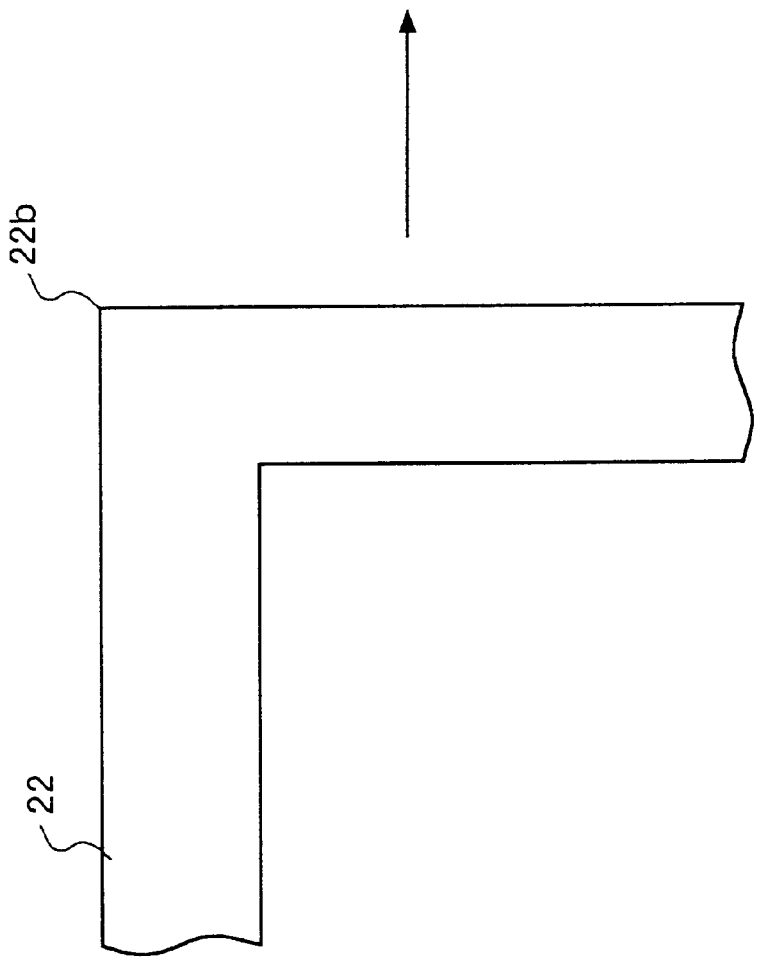
FIG.12

US 6,449,758 B1

APPARATUS FOR AND METHOD OF AUTOMATICALLY PLACING AND ROUTING

FIELD OF THE INVENTION

The present invention relates to an apparatus for and a method of automatically placing and routing, which automatically generates pattern data for a mask that is used in the photolithography process when manufacturing a semiconductor integrated circuit device.

BACKGROUND OF THE INVENTION

As part of the manufacturing process for manufacturing a semiconductor integrated circuit device, there is a photolithography process in which a photosensitive resist having been coated onto the surface of a semiconductor wafer is exposed, via a mask having a desired mask pattern drawn therein, and then the resist is developed to form a resist mask. FIG. 8 and FIG. 9 each are a longitudinal sectional view illustrating how a metal distribution of a semiconductor integrated circuit apparatus is formed in the photolithography process. As illustrated in FIG. 8, for example, when forming a metal distribution, a metal distribution layer 13 is laminated via a layer insulation film 12 on a semiconductor wafer in which transistor etc. has been formed. Then, a resist film 14 is laminated on the surface of this metal distribution layer 13. Then, the resist film 14 is exposed using a mask 15 on which a distribution pattern has been drawn.

The resulting structure is developed as explained in FIG. 9. The exposed portion of the resist film is dissolved to thereby cause the non-exposed portion to remain as is. By performing etching treatment by using this remaining portion 16 as a mask, a metal distribution having a desired pattern is formed in the metal distribution layer 13. When the mask pattern is fine, the pattern width W2 of the actually obtained remaining resist portion 16 becomes inconveniently small in width compared to the pattern width W1 as initially designed due to the light proximity effect. Accordingly, the line width of the metal distribution that is obtained after performance of the etching treatment also becomes inconveniently narrower than the initially designed value.

FIG. 10 is a typical view illustrating part of a layout pattern that has been prepared using an automatic placing and routing apparatus. In the figure, the reference numeral 21 denotes a standard cell, and the reference numeral 22 denotes a distribution between the standard cells 21. The above-described narrowing of the distribution width due to the light proximity effect occurs at an end 22a (FIG. 11), or a bend 22b (FIG. 12) of the distribution 22. Namely, the line width of the end 22a or the bend 22b of the distribution 22 inconveniently becomes narrower than the originally designed value (the left side views in FIG. 11 and FIG. 12).

To account this, conventionally, as illustrated in FIG. 13, with respect to the end 22a or bend 22b of the distribution 22, preparation is made of data (hereinafter called "additional distribution data") for providing additional distribution portions 23a, 23b for correcting the portion of the distribution where possibly the distribution width inconveniently becomes narrower in an actual process. These additional distribution portions 23a, 23b are generated using a layout verifying apparatus, after having prepared cell-assignment-pattern data and distribution-pattern data by using the automatic placing and routing apparatus.

FIG. 14 is a functional block diagram illustrating a conventional system for preparing the additional distribution data in accordance with the additional-distribution-data preparing procedure. With reference to this figure, the construction of this system will now be explained along with the additional-distribution-data preparing procedure. First, arrangement data and wire distribution data are prepared by the automatic placing and routing apparatus 31 to obtain source layout data 32. This source layout data 32 does not include the above-described additional distribution data.

Subsequently, using the source layout data 32 and a layout-verifying rule file 34 for generating additional distribution data, verification of the layout is performed by a layout verifying apparatus 33 to thereby obtain additional distribution data production information 35. According to the additional distribution data production information 35 and the source layout data 32, corrected layout data 36 containing the additional distribution data therein is obtained. And, using the corrected layout data 36 and a rule file 37 for verifying the layout data as a whole, verification of the layout is performed again by the layout verifying apparatus 33, thereby obtaining final pattern data 38 for use on a mask. This pattern data 38 for use on a mask includes the additional distribution data.

However, in the above-described conventional additional distribution data preparation method, a significantly longer time is needed for obtaining the final pattern data for use on a mask that includes the additional distribution data therein, so that the efficiency is disadvantageously poor.

SUMMARY OF THE INVENTION

The present invention has been made in order to solve the above-described problem and an object of the invention is to provide an apparatus for and a method of automatically placing and routing which, in a state of designing the mask used to manufacture a semiconductor integrated circuit device, makes it possible to quickly obtain final pattern data containing additional distribution data therein.

According to this invention, the cell assigning section automatically performs assignment of the cells according to the circuit data, the distribution path determining section automatically determines the distribution path between the cells that have been assigned, the distribution information extracting section extracts the information regarding the distribution path that has been determined, the prescribed-information recognizing section recognizes the information of a prescribed portion of the distribution according to information that has been extracted, the additional-distribution-data generating section generates the additional distribution data for correcting the width of distribution of the prescribed portion of the distribution that has been recognized, and the additional-distribution-data lay-out section lays out the additional distribution data that has been generated with respect to the prescribed portion of the distribution.

In this invention, the prescribed portion of the distribution may be an end or a bend of the distribution. With such a configuration, the prescribed-information recognizing section recognizes the information of the end or the bend as the prescribed portion of the distribution, the additional-distribution-data generating section generates the additional distribution data for correcting the width of distribution of the end or the bend of the distribution that has been recognized, and the additional-distribution-data lay-out section lays out the additional distribution data that has been generated with respect to the end or the bend of the distribution.

Further, a construction may be made wherein the additional-distribution-data lay-out section imparts a layer number different from that of the prescribed portion of the distribution to additional distribution data corresponding to this prescribed portion. With this configuration, the layer number of the prescribed portion of the distribution and the layer number of the additional distribution data corresponding to this prescribed portion become different from each other.

Further, a construction may be made wherein the additional-distribution-data generating section generates additional distribution data in such a way that a different size of additional distribution is laid out when the prescribed portion of the distribution is an end and when this prescribed portion is a bend. With this configuration, there is generated additional distribution data in such a way that a different size of additional distribution is laid out between when the prescribed portion of the distribution is an end and when this prescribed portion is a bend.

According to this invention, the assignment of the cells is automatically performed according to circuit data in the cell assigning step, the distribution path between the cells that have been assigned is automatically determined in the distribution path determining step, information regarding the distribution path that has been determined is extracted in the distribution information extracting step, information of a prescribed portion of the distribution is recognized according to the information that has been extracted in the prescribed-information recognizing step, additional distribution data for correcting the width of distribution is generated with respect to the prescribed portion of the distribution that has been recognized in the additional-distribution-data generating step, and the additional distribution data that has been generated is laid out with respect to the prescribed portion of the distribution in the additional-distribution-data lay-out step.

In this invention, the prescribed portion of the distribution may be an end or a bend of the distribution. With this configuration, in the prescribed-information recognizing step the information of the end or the bend as the prescribed portion of the distribution is recognized, in the additional-distribution-data generating step the additional distribution data for correcting the width of distribution is generated with respect to the end or the bend of the distribution that has been recognized, and in the additional-distribution-data lay-out step the additional distribution data that has been generated is laid out with respect to the end or the bend of the distribution.

Further, a construction may be made wherein in the additional-distribution-data lay-out step a layer number different from that of the prescribed portion of the distribution is imparted to additional distribution data corresponding to the prescribed portion. With this configuration, the layer number of the prescribed portion of the distribution and the layer number of the additional distribution data corresponding to this prescribed portion become different from each other.

Further, a construction may be made wherein in the additional-distribution-data generating step additional distribution data is generated in such a way that a different size of additional distribution is laid out when the prescribed portion of the distribution is an end and when this prescribed portion is a bend. With this configuration, there is generated additional distribution data in such a way that a different size of additional distribution is laid out when the prescribed portion of the distribution is an end and when this prescribed portion is a bend.

Other objects and features of this invention will become understood from the following description with reference to the accompanying drawings.

BRIEF DESCRIPTION OF THE DRAWINGS

FIG. 12 is a typical view illustrating a state in which the distribution width occurring at a bend of the distribution due to the light proximity effect;

DESCRIPTION OF THE PREFERRED EMBODIMENTS

Embodiments of the apparatus for and the method of automatically placing and routing according to the present invention will now be explained in detail with reference to the drawings.

Figure 1:
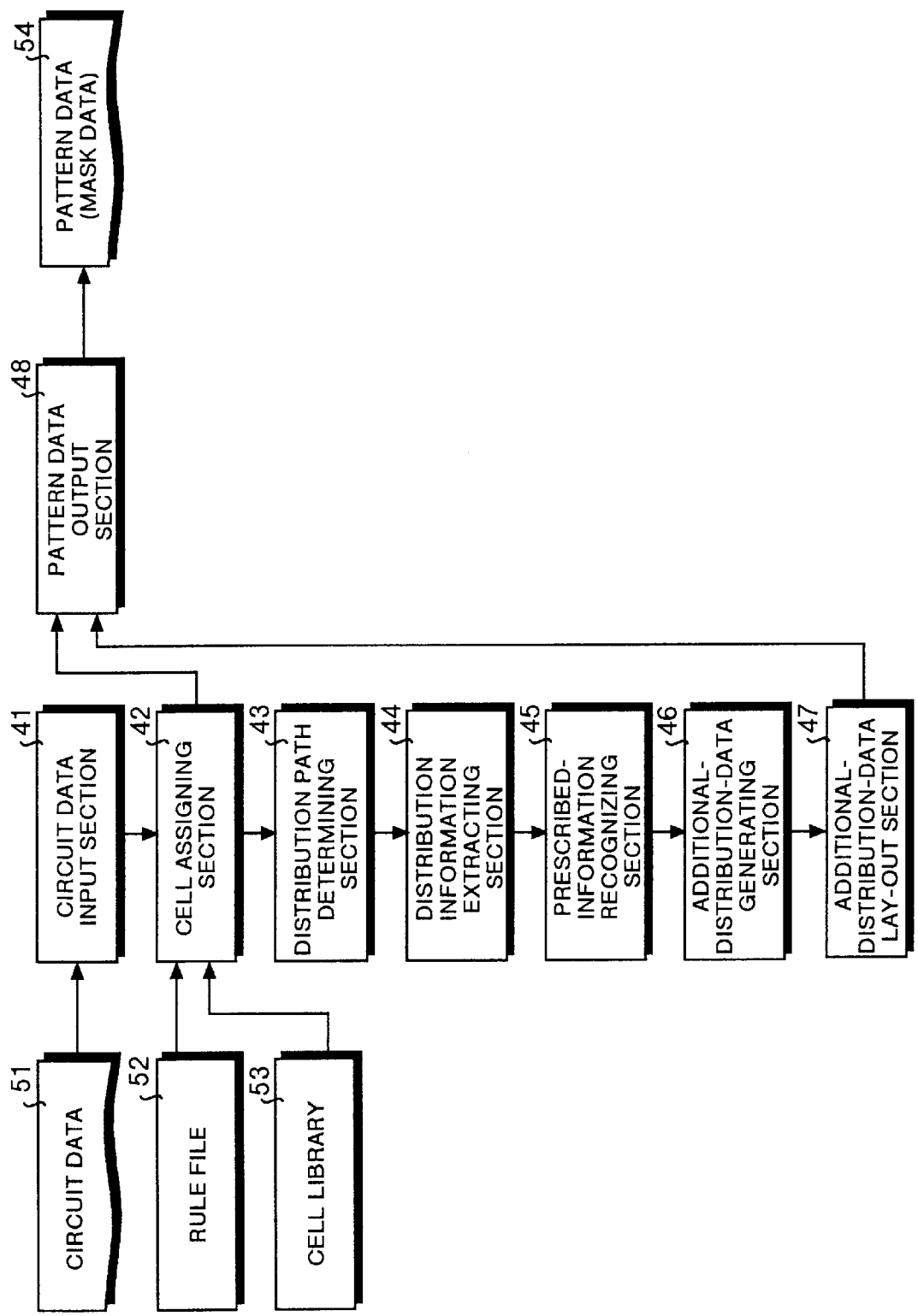
FIG. 1 is a block diagram illustrating an example of the structure of an automatic placing and routing apparatus according to the present invention.

FIG. 1 is a block diagram illustrating an example of the structure of the apparatus for automatically placing and routing according to the present invention. This apparatus for automatically placing and routing has a circuit data input section 41, a cell assigning section 42, a distribution path determining section 43, a distribution information extracting section 44, a prescribed-information recognizing section 45, an additional-distribution-data generating section 46, an additional-distribution-data lay-out section 47, and a pattern-data outputting section 48.

The circuit data input section 41 takes in a circuit data 51 that has been input from the outside. The circuit data 51 contains therein logic connecting information. Cell-assignment information and between-cell distribution information are designed by the cell assigning section 42 and distribution path determining section 43. The cell assigning section 42 automatically performs cell assignments according to the circuit data 51, a rule file 52, and a cell library 53 that have been input thereto. The rule file 52 describes design rules and layer (distribution layer) definitions for making an automatic placing and routing. The circuit data 55 is a database constructed by inputting the circuit data 51 to the circuit data input section 41.

The distribution path determining section 43 automatically determines the distribution path between the cells that have been assigned by the cell assigning section 42. The distribution information extracting section 44 extracts information such as the coordinates, distribution names, and layer numbers, for all the distribution paths that have been determined by the distribution path determining section 43. The prescribed-information recognizing section 45 recognizes information on a prescribed portion of the distribution, according to the information extracted by the distribution information extracting section 44, namely, according to the information such as the coordinates, wire distribution layout names, and layer numbers for all the distribution paths. In the first embodiment, the prescribed-information recognizing section 45 recognizes the coordinates, distribution names, layer numbers, etc. of an end of the distribution.

The additional-distribution-data generating section 46 generates, with respect to a prescribed portion, e.g. an end, of the distribution recognized by the prescribed-information recognizing section 45, additional distribution data for making a correction of the width of this distribution. The additional-distribution-data lay-out section 47 lays out the distribution data of all the distribution paths determined by the distribution path determining section 43, and the additional distribution data generated by the additional-distribution-data generating section 46. The pattern data output section 48 outputs as pattern data (mask data) 54 for making a distribution the wire distribution data of all the distribution paths and the additional wire distribution data that have been laid out by the additional distribution data lay-out section 47. Also, the pattern data output section 48 outputs to the outside the pattern data (mask data) 54 regarding the cell that has been assigned by the cell assigning section 42.

Figure 2:
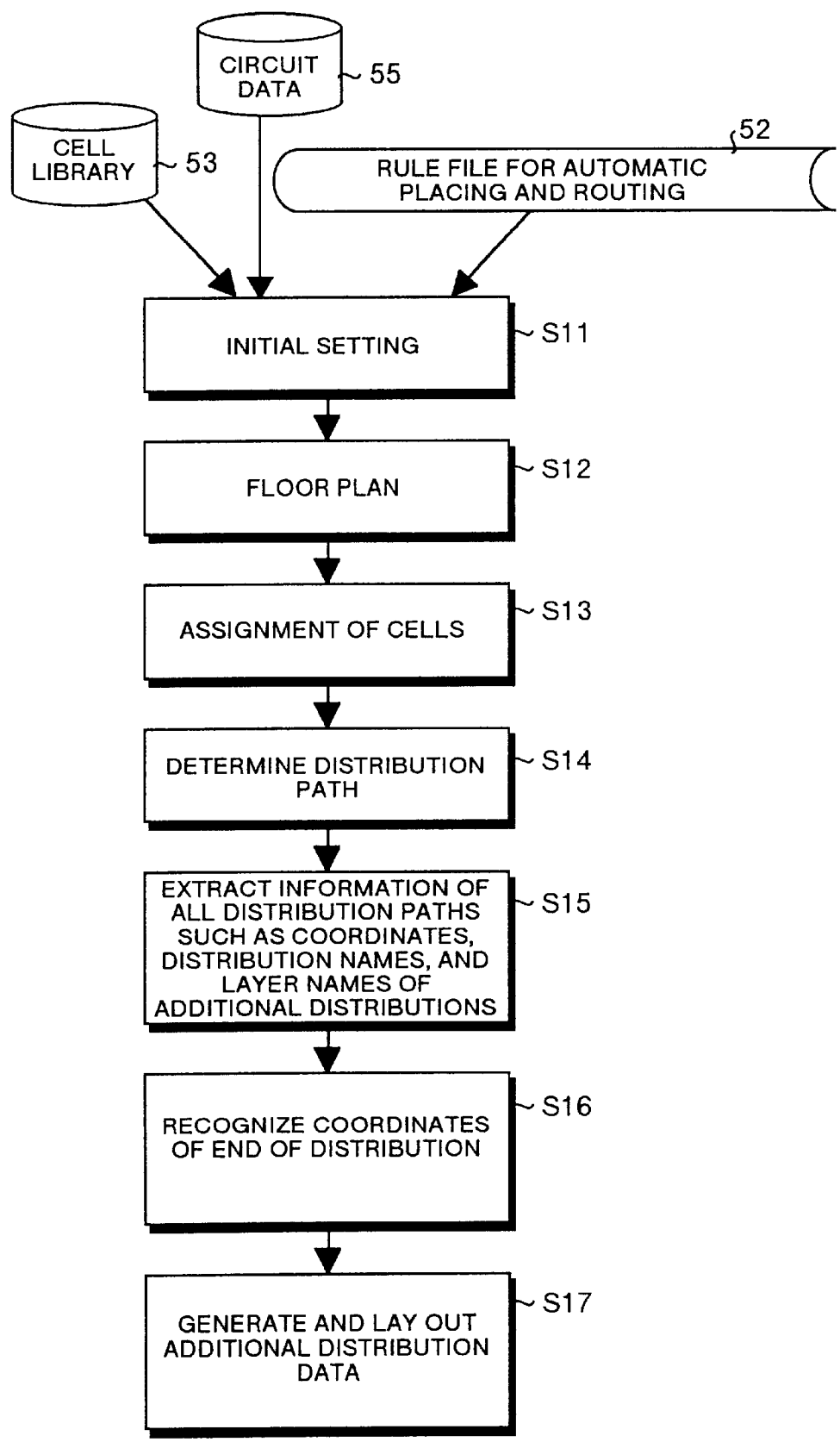
FIG. 2 is a flow chart illustrating a first embodiment of an automatic placing and routing method according to the present invention.

Next, a procedure of generating the pattern data (mask data) 54 for wire distribution by the use of a method of automatically placing and routing according to the present invention will be explained. FIG. 2 is a flow chart illustrating an example of this procedure. Upon start of an automatic cell assignment and an automatic wire distribution, first, initial settings are performed by compilation of the rule file 52 and by reference to the cell library 53 (step S11). Then, a floor plan is executed (step S12) and, thereafter, cells are assigned (step S13).

Figure 3:
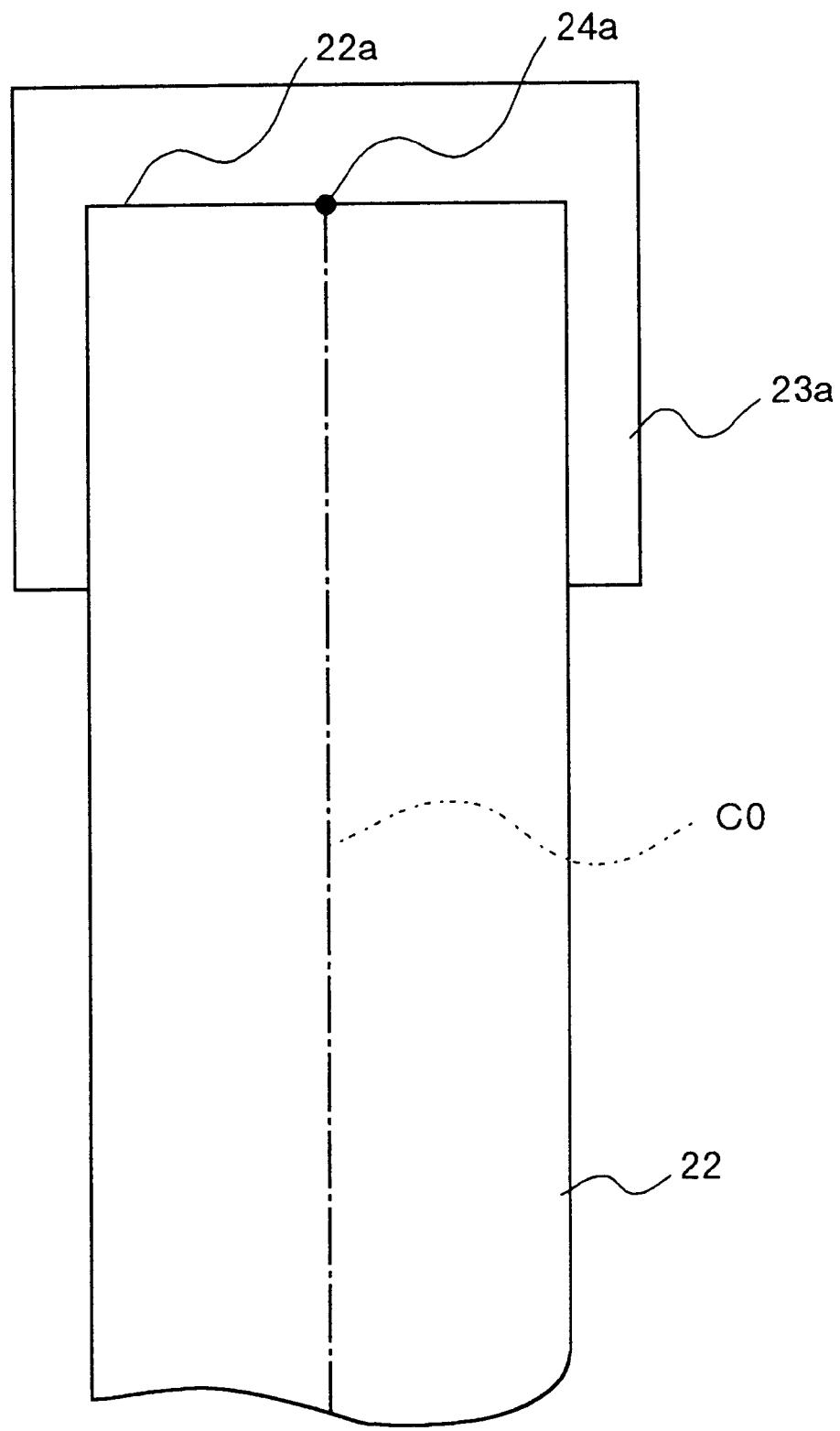
FIG. 3 is a typical view illustrating a specific point that specifies the coordinates of an end of the distribution in the first embodiment.

Subsequently, the distribution paths between the cells that have been assigned are determined (step S14). Then, regarding all the distribution paths, information such as the coordinates, distribution names, and layer numbers (layer names) is extracted (step S15). According to the thus-extracted information, the coordinates, distribution name, and layer number of a prescribed portion, e.g. an end of the distribution are recognized (step S16). Here, as illustrated in FIG. 3, the coordinates of the end 22a of the distribution 22 are the coordinates of the intersection point 24a between a central line C0 (indicated by a one-dot chain line in FIG. 3) of the wire distribution 22 and the edge thereof.

Turning back to FIG. 2, subsequently to step S16, distribution is made according to the distribution paths that have been determined in step S14. At this time, additional distribution data for correcting the width of the distribution is generated with respect to the end 22a of the distribution 22, and this data is also simultaneously laid out (step S17). As illustrated in FIG. 3, an additional distribution portion 23a to which this additional distribution data is applied is so arranged as to surround the end 22a of the distribution 22.

According to the first embodiment, the additional distribution data for correcting the width of distribution of the end 22a of the distribution 22 is generated and laid out by the automatic placing and routing apparatus. Therefore, in the actual manufacturing process a semiconductor integrated circuit device, it is possible to generate the additional distribution data for preventing the width of distribution of the end 22a of the distribution 22 from becoming narrowed due to the light proximity effect without using a layout verifying apparatus. Therefore, it is possible to shorten the time required for developing a semiconductor integrated circuit device.

Incidentally, the automatic placing and routing apparatus according to this embodiment is not limited to the one illustrated in FIG. 1 and of course permits various design modifications to be made. Further, the additional distribution data lay-out section 47 may be constructed in such a way as to set the layer number of the additional distribution data at a number that is different from the layer number of the distribution 22 to which this additional distribution data is to be laid out. By doing so, the layer number of the distribution 22 is different from the layer number of the additional distribution data that is applied to this distribution 22. Therefore, when having performed layout verification with respect to the whole of the layout pattern to which the additional distribution data has been laid out by the use of a layout verifying apparatus, the following advantage is obtained. Namely, it becomes possible to prevent the interval between the end 22a of the distribution 22 to which the additional distribution data has been laid out and the distribution adjoining to this end 22a from being determined as being narrower than the interval of the design rule by the layout verifying apparatus.

Next, a second embodiment of the present invention will be explained. However, the construction of the automatic placing and routing apparatus is the same as the apparatus of the first embodiment illustrated in FIG. 1 so that explanation thereof is omitted. The second embodiment is different from the first embodiment wherein the end of the distribution has been regarded as being the prescribed portion thereof, in that a bend of the distribution is regarded as being the prescribed portion thereof.

Figure 4:
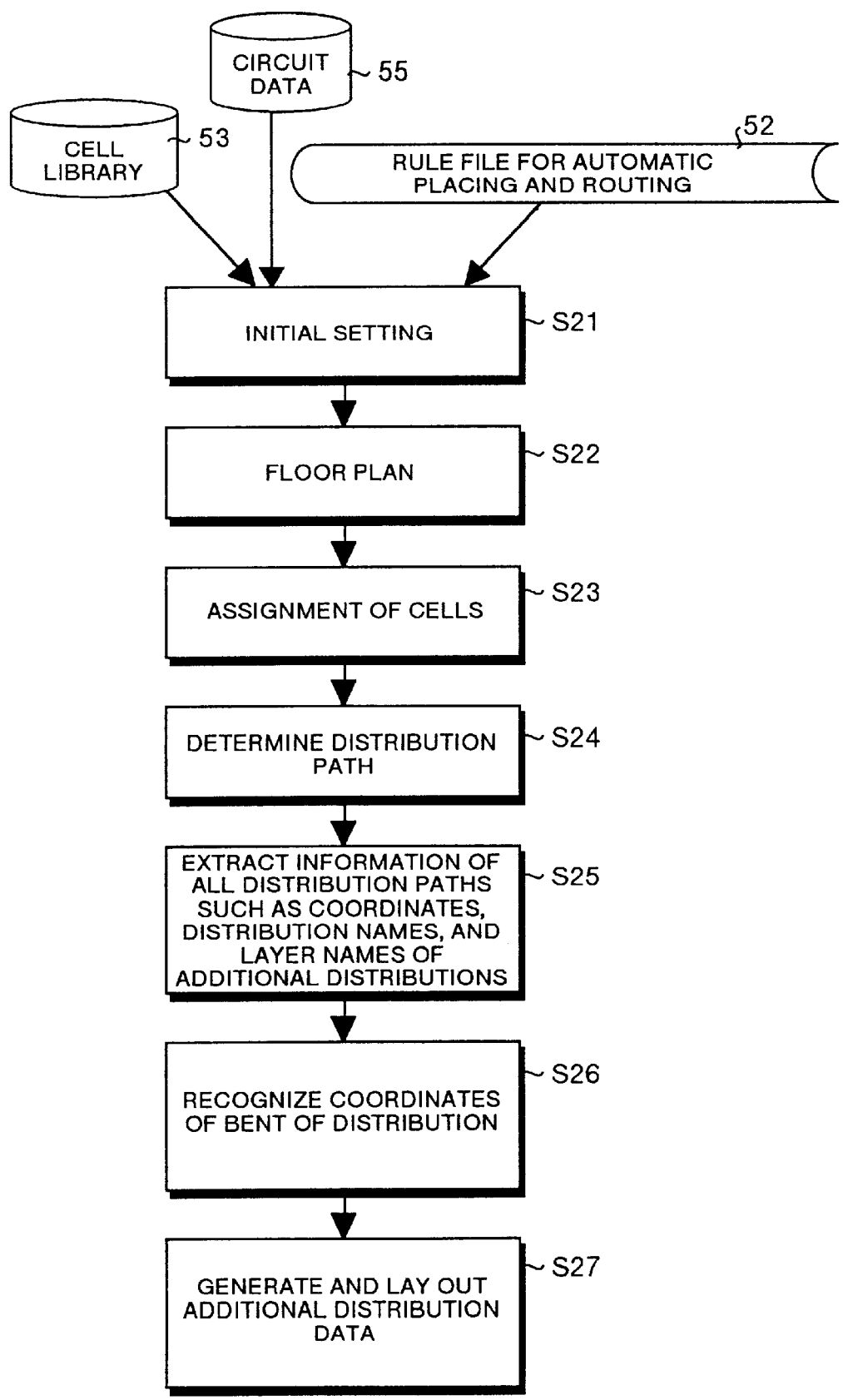
FIG. 4 is a flow chart illustrating a second embodiment of the automatic placing and routing method according to the present invention.

FIG. 4 is a flow chart illustrating an example of the procedure of the second embodiment. When automatic placing and routing have been started, first, initial settings are performed by compilation of the rule file 52 and by reference to the cell library 53 (step S21). Then, a floor plan is executed (step S22) and, thereafter, cells are assigned (step S23).

Figure 5:
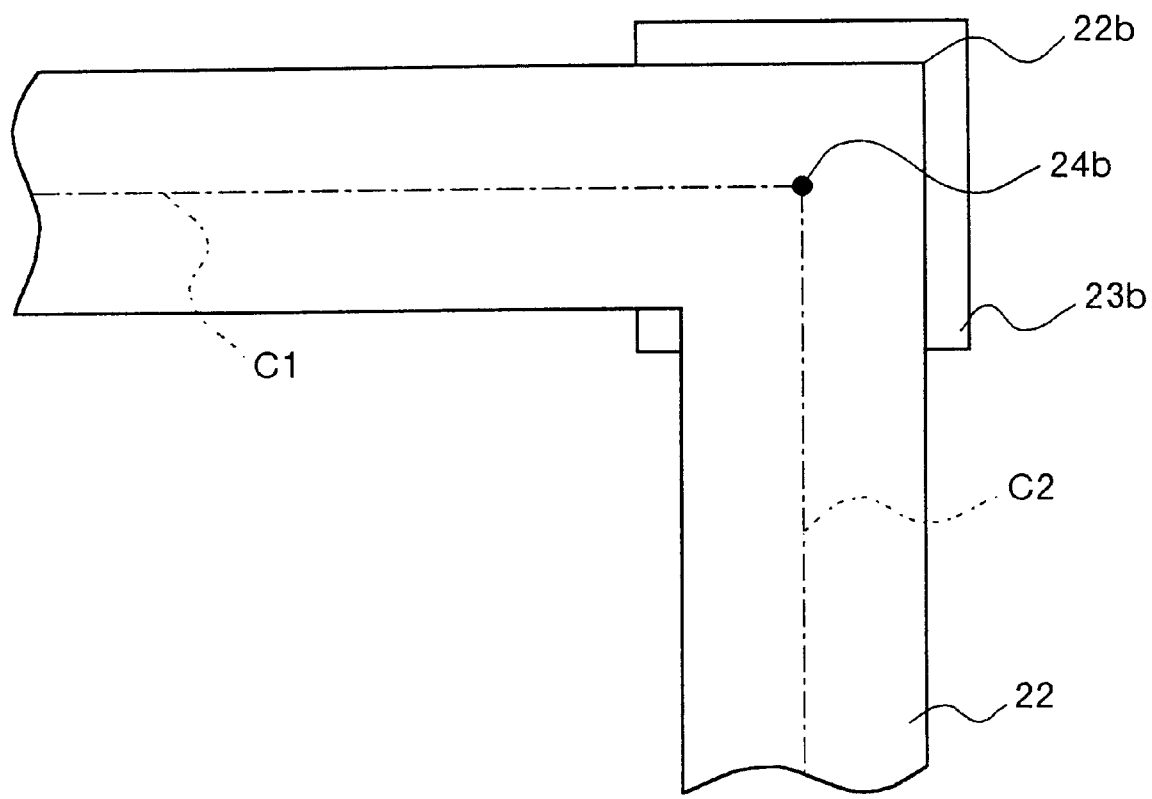
FIG. 5 is a typical view illustrating a specific point that specifies the coordinates of a bend of the distribution in the second embodiment.

Subsequently, the distribution paths between the cells that have been assigned are determined (step S24). Then, regarding all the distribution paths, information such as the coordinates, distribution names, and layer numbers is extracted (step S25). According to the thus-extracted information, the coordinates, distribution name, and layer number of a bend of the distribution are recognized (step S26). Here, as illustrated in FIG. 5, the coordinates of the bend 22b of the distribution 22 are the coordinates of the intersection point 24b between the central lines C1 and C2 (indicated by one-dot chain lines in FIG. 5) in two directions of the distribution 22.

Turning back to FIG. 4, subsequently to step S26, distribution is made according to the distribution paths that have been determined in step S24. At this time, additional distribution data for correcting the width of the distribution is generated with respect to the bend 22b of the distribution 22, and this data is also simultaneously laid out (step S27). As illustrated in FIG. 5, an additional distribution portion 23b to which this additional distribution data is applied is so arranged as to surround the bend 22b of the distribution 22.

According to the second embodiment, the additional distribution data for correcting the distribution width of the bend 22b of the distribution 22 is generated and laid out by the automatic placing and routing apparatus. Therefore, in the actual manufacturing process a semiconductor integrated circuit device, it is possible to generate the additional distribution data for preventing the distribution width of the bend 22b of the distribution 22 from becoming narrowed due to the light proximity effect without using a layout verifying apparatus. Therefore, it becomes possible to shorten the time required for developing a semiconductor integrated circuit device.

Incidentally, in the second embodiment, also, as in the case of the first embodiment, the additional distribution data lay-out section 47 may be constructed in such a way as to set the layer number of the additional distribution data at a number that is different from the layer number of the distribution 22 to which this additional distribution data is to be laid out. By doing so, the layer number of the distribution 22 is different from the layer number of the additional distribution data that is applied to this distribution 22. Therefore, when having performed layout verification with respect to the whole of the layout pattern to which the additional distribution data has been laid out by the use of a layout verifying apparatus, the following advantage is obtained. Namely, it becomes possible to prevent the interval between the bend 22b of the distribution 22 to which the additional distribution data has been laid out and the distribution adjoining to this bend 22b from being determined as being narrower than the interval of the design rule by the layout verifying apparatus.

Next, a third embodiment of the present invention will be explained. However, the construction of the automatic placing and routing apparatus is the same as the construction of the apparatus of the first embodiment illustrated in FIG. 1 so that explanation thereof is omitted. The third embodiment is arranged so that the additional distribution portion of the end of the distribution may be differentiated in size from that of the bend of the distribution.

Figure 6:
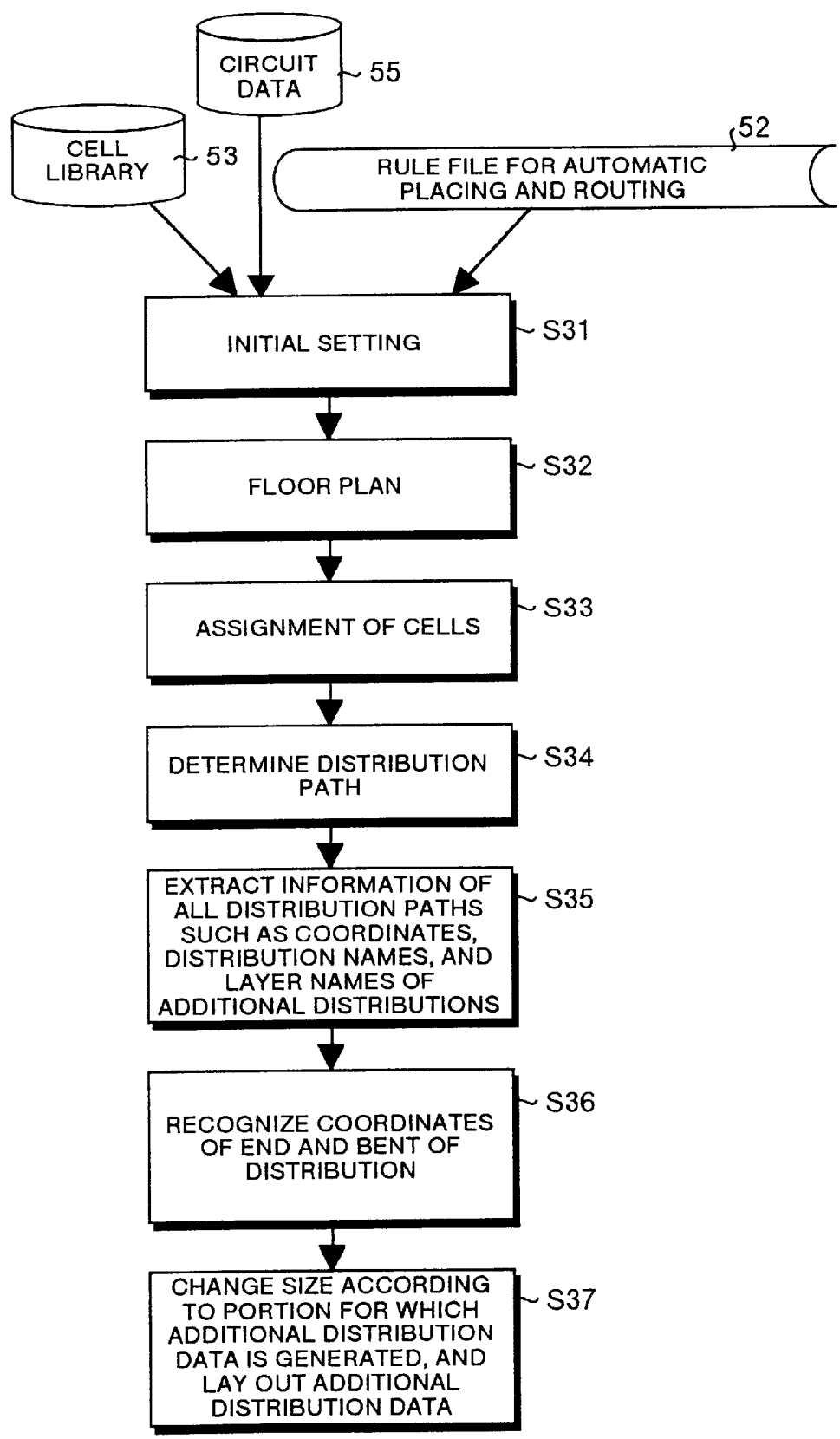
FIG. 6 is a flow chart illustrating a third embodiment of the automatic placing and routing method according to the present invention.

FIG. 6 is a flow chart illustrating an example of the procedure of the third embodiment. When automatic placing and routing have been started, first, initial settings are performed by compilation of the rule file 52 and by reference to the cell library 53 (step S31). Then, a floor plan is executed (step S32) and, thereafter, cells are assigned (step S33).

Figure 7:
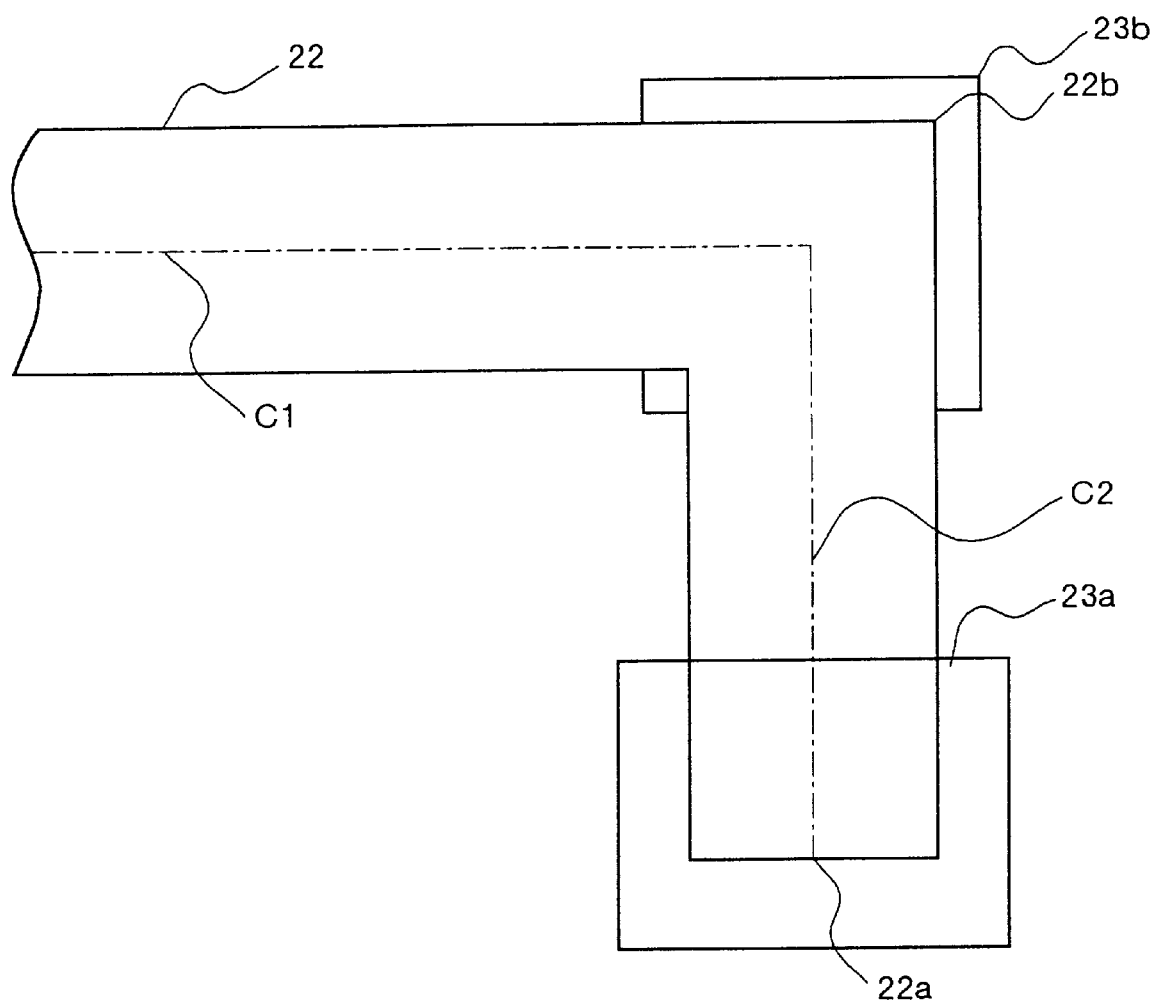
FIG. 7 is a typical view illustrating a state wherein, in the third embodiment, the size of the additional distribution portion that is added to each of the end and the bend of the distribution differs.
Figure 8:
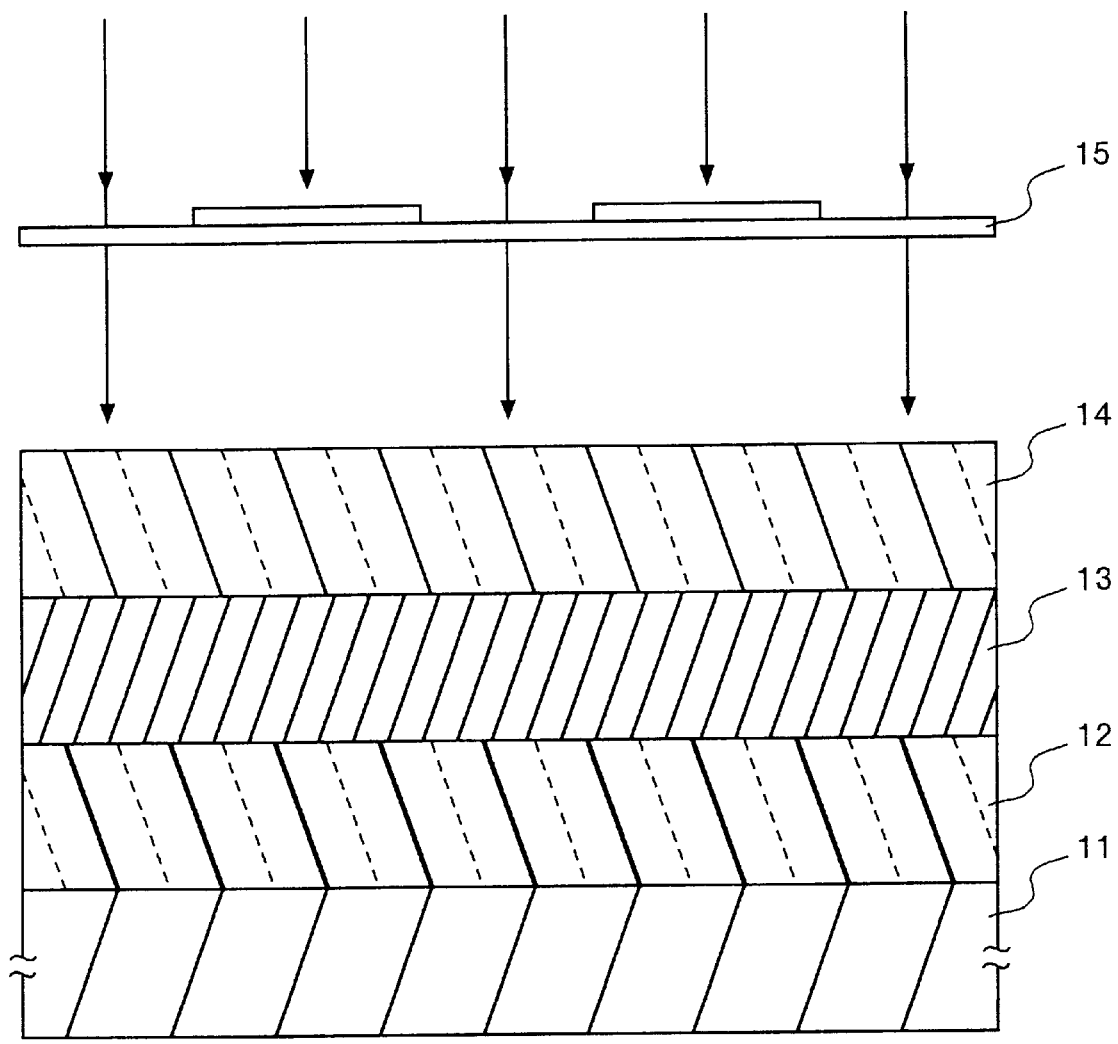
FIG. 8 is a longitudinal sectional view illustrating a state wherein a metal distribution of a semiconductor integrated circuit device is formed by a photolithography process.
Figure 9:
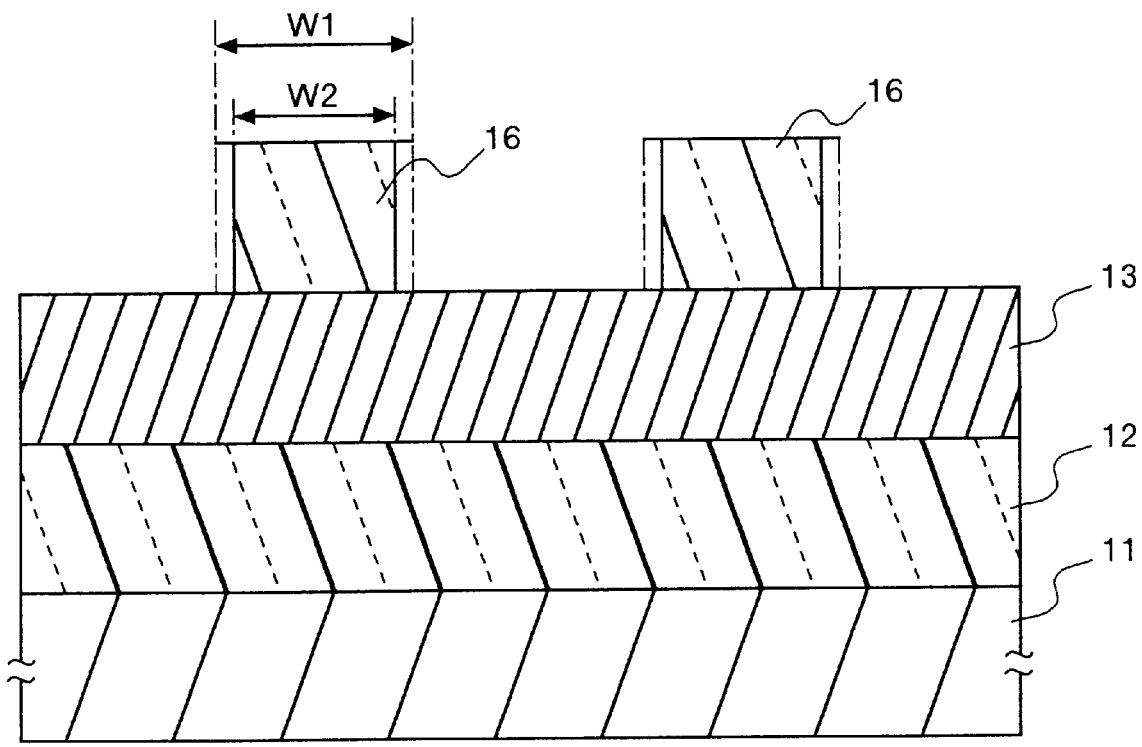
FIG. 9 is a longitudinal sectional view illustrating a state wherein a metal distribution of a semiconductor integrated circuit device is formed by a photolithography process.
Figure 10:
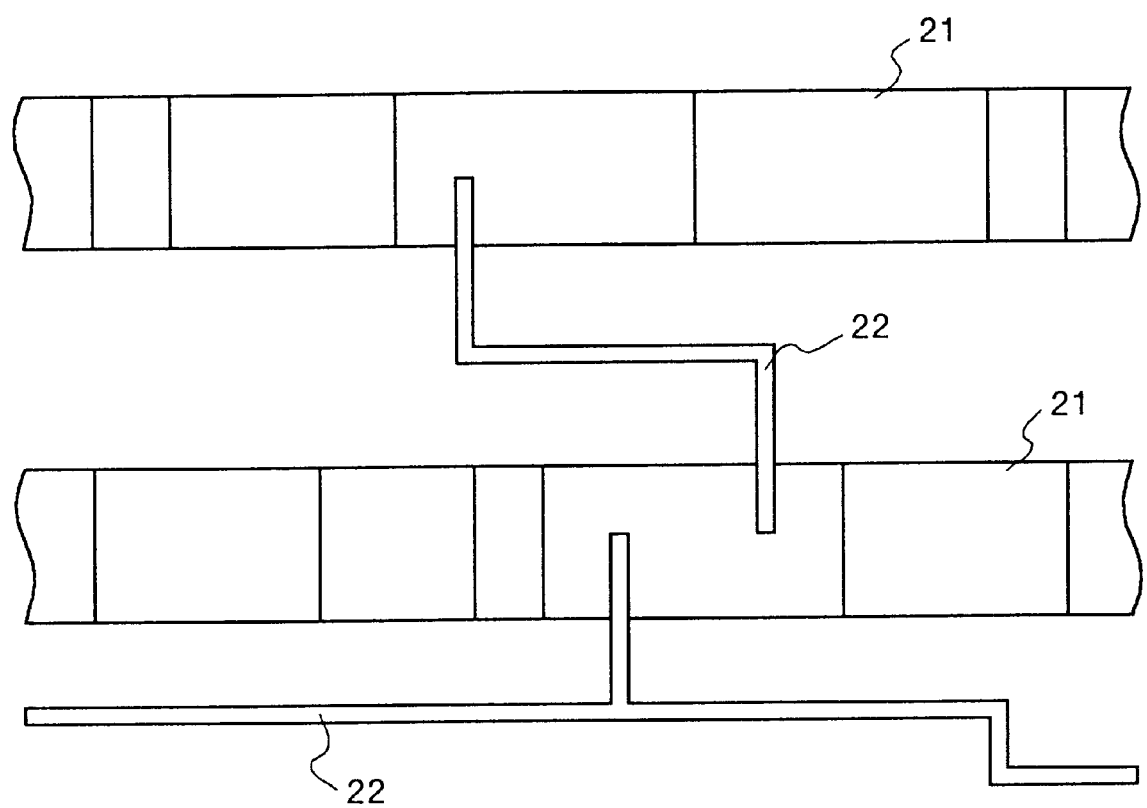
FIG. 10 is a typical view illustrating part of a layout pattern that has been prepared using an automatic placing and routing apparatus.
Figure 11:
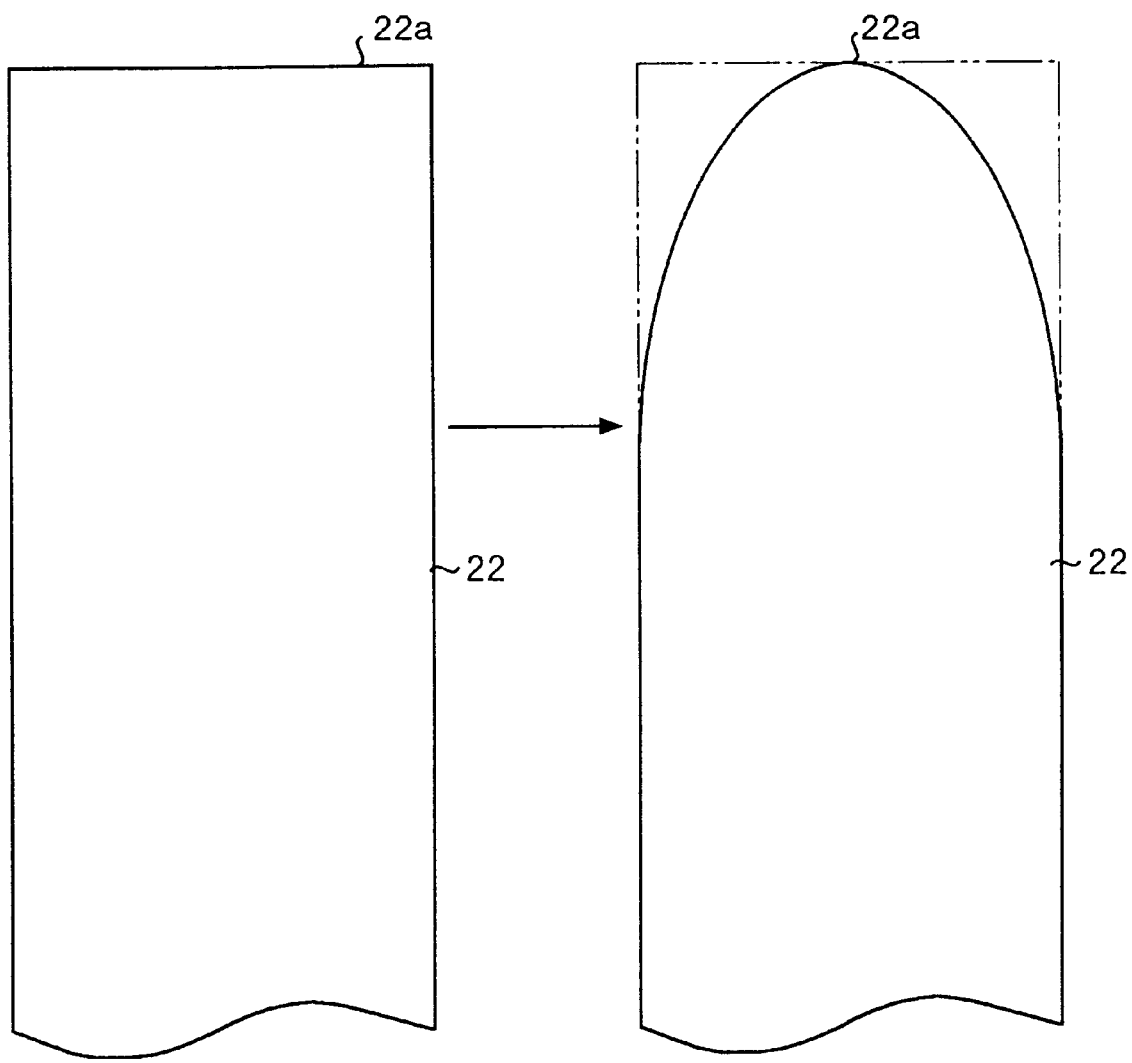
FIG. 11 is a typical view illustrating a state in which the distribution width at an end of the distribution has become narrower due to the light proximity effect.
Figure 13:
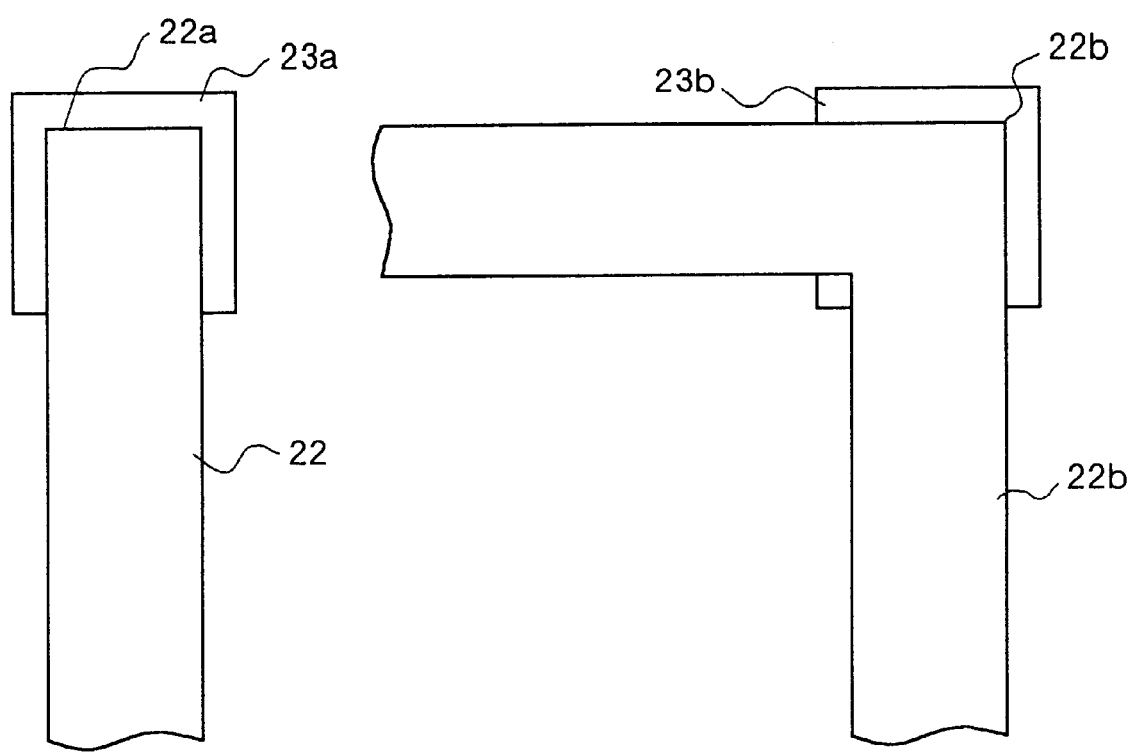
FIG. 13 is a typical view illustrating a state wherein additional distribution data has been added to the distribution data of the end or the bend of the distribution.
Figure 14:
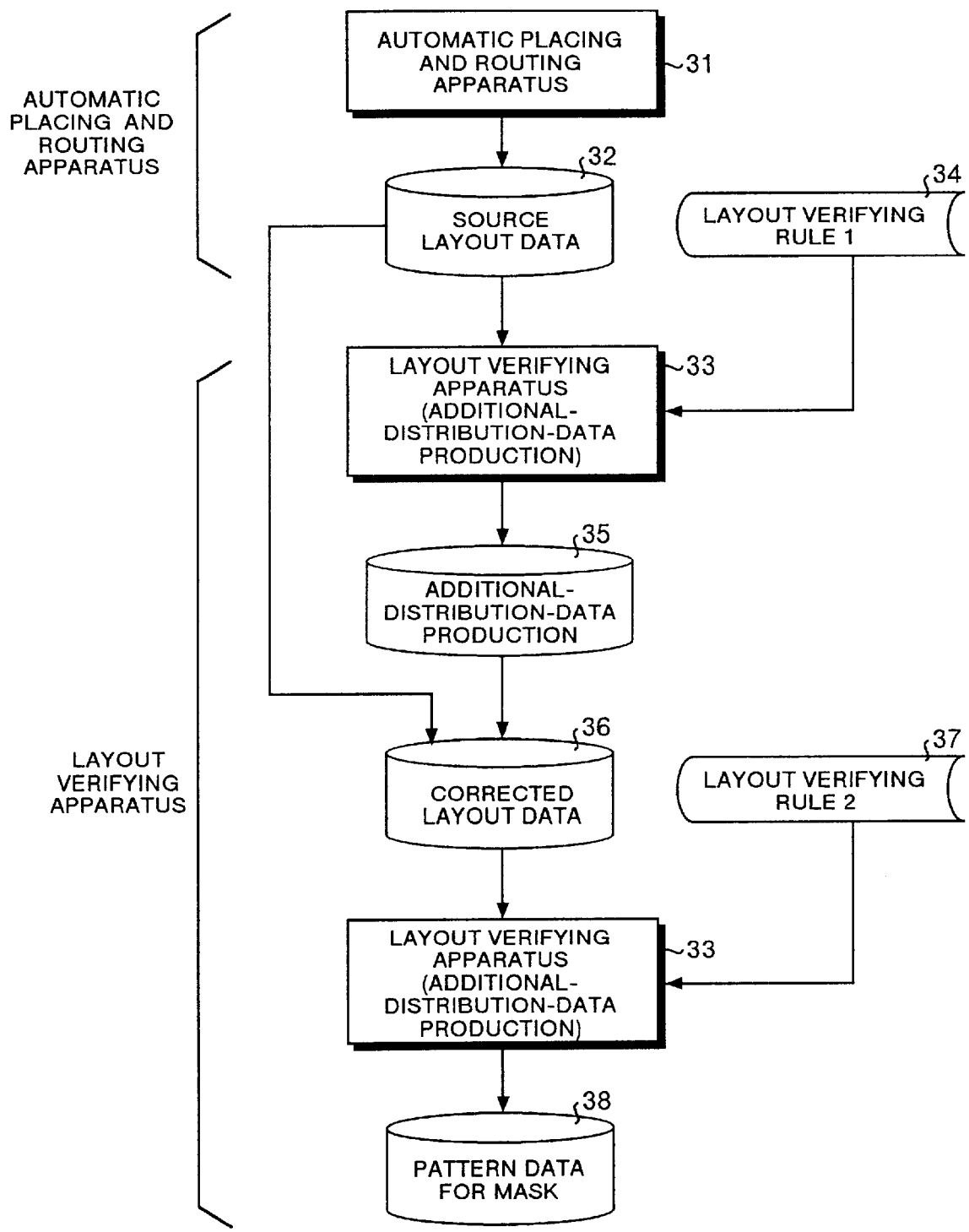
FIG. 14 is a functional block diagram illustrating a conventional system for preparing additional distribution data in accordance with the procedure of generating additional distribution data.

Subsequently, the distribution paths between the cells that have been assigned are determined (step S34). Then, regarding all the distribution paths, information such as the coordinates, distribution names, and layer numbers is extracted (step S35). According to the thus-extracted information, the coordinates, distribution names, and layer numbers of both the end and the bend of the distribution are recognized (step S36). And, distribution is made according to the distribution paths that have been determined in step S34. At this time, additional distribution data for correcting the width of the distribution is generated with respect to the end and the bend of the distribution, and this data is also simultaneously laid out (step S37). At this time, since in the etching treatment performed in an actual manufacturing process the proportion in which the distribution width of the end of the distribution is narrowed and the proportion in which the distribution width of the bend thereof is narrowed is different from each other. As illustrated in FIG. 7, the additional distribution portion 23a to which the additional distribution data with respect to the end 22a of the distribution 22 is applied and the additional distribution portion 23b to which the additional distribution data with respect to the bend 22b is applied has a different size.

According to the third embodiment, since two kinds of additional distribution data pieces are respectively generated so that appropriate sizes of the additional distribution portions 23a, 23b may be respectively laid out with respect to the end 22a and the bend 22b of the distribution 22, the quality of a semiconductor integrated circuit device that has been obtained by being manufactured is enhanced.

As has been described above, according to the automatic placing and routing apparatus of the present invention, the cell assigning section automatically performs assignment of the cells according to the circuit data, the distribution path determining section automatically determines the distribution path between the cells that have been assigned, the distribution information extracting section extracts the information regarding the distribution path that has been determined, the prescribed-information recognizing section recognizes the information of a prescribed portion of the distribution according to information that has been extracted, the additional-distribution-data generating section generates the additional distribution data for correcting the width of distribution of the prescribed portion of the distribution that has been recognized, and the additional-distribution-data lay-out section lays out the additional distribution data that has been generated with respect to the prescribed portion of the distribution. Accordingly, without using a layout verifying apparatus, it is possible to generate additional distribution data with respect to the prescribed portion of the distribution by using the automatic placing and routing apparatus. Thus, it is possible to shorten the time required for developing a semiconductor integrated circuit device.

According to another embodiment of the invention, the prescribed-information recognizing section recognizes the information of an end or a bend as the prescribed portion of the distribution, the additional-distribution-data generating section generates the additional distribution data for correcting the width of distribution of the end or the bend of the distribution that has been recognized, and the additional-distribution-data lay-out section lays out the additional distribution data that has been generated with respect to the end or the bend of the distribution. Accordingly, without using a layout verifying apparatus, it is possible to generate and lay out additional distribution data with respect to the end or the bend of the distribution by using the automatic placing and routing apparatus. Thus, it is possible to shorten the time required for developing a semiconductor integrated circuit device.

According to still another embodiment of the invention, the layer number of the prescribed portion of the distribution and the layer number of the additional distribution data corresponding to this prescribed portion is different from each other. Therefore, when having performed layout verification by a layout verifying apparatus with respect to the whole layout pattern including the laid-out additional distribution data, it is possible to prevent the layout verifying apparatus from determining the interval between the prescribed portion of the distribution having the additional distribution data laid out with respect thereto and the distribution adjoining to this prescribed portion as being narrower than the interval of the design rule.

According to a further embodiment of the invention, additional distribution data is generated in such a way that a different size of additional distribution is laid out when the prescribed portion of the distribution is an end and when this prescribed portion is a bend. Therefore, it is possible to lay out appropriate additional distribution data in correspondence with the portion having additional distribution data laid out with respect thereto. This enhances the quality of a semiconductor integrated circuit device.

According to the automatic placing and routing method of the present invention, in the cell assigning step the assignment of the cells is automatically performed according to circuit data, in the distribution path determining step the distribution path between the cells that have been assigned is automatically determined in the distribution information extracting step information regarding the distribution path that has been determined is extracted, in the prescribed-information recognizing step information of a prescribed portion of the distribution is recognized according to the information that has been extracted, in the additional-distribution-data generating step additional distribution data for correcting the width of distribution is generated with respect to the prescribed portion of the distribution that has been recognized, and in the additional-distribution-data lay-out step the additional distribution data that has been generated is laid out with respect to the prescribed portion of the distribution. Accordingly, without performing layout verification, it is possible to generate and lay out additional distribution data with respect to the prescribed portion of the distribution. Thus, it is possible to shorten the time required for developing a semiconductor integrated circuit device.

According to another embodiment of the invention, in the prescribed-information recognizing step the information of an end or a bend as the prescribed portion of the distribution is recognized, in the additional-distribution-data generating step the additional distribution data for correcting the width of distribution is generated with respect to the end or the bend of the distribution that has been recognized, and in the additional-distribution-data lay-out step the additional distribution data that has been generated is laid out with respect to the end or the bend of the distribution. Accordingly, without performing layout verification, it is possible to generate and lay out additional distribution data with respect to the prescribed portion of the distribution. Thus, it is possible to shorten the time required for developing a semiconductor integrated circuit device.

According to a further embodiment of the invention, the layer number of the prescribed portion of the distribution and the layer number of the additional distribution data corresponding to this prescribed portion are different from each other. Therefore, when having performed layout verification by a layout verifying apparatus with respect to the whole layout pattern including the laid-out additional distribution data, it is possible to prevent the layout verifying apparatus from determining that the interval between the prescribed portion of the distribution having the additional distribution data laid out with respect thereto and the distribution adjoining to this prescribed portion as being narrower than the interval of the design rule.

According to a still further embodiment of the invention, there is generated additional distribution data in such a way that a different size of additional distribution is laid out between when the prescribed portion of the distribution is an end and when this prescribed portion is a bend. Therefore, it is possible to lay out appropriate additional distribution data in correspondence with the portion having additional distribution data laid out with respect thereto. This enhances the quality of a semiconductor integrated circuit device.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. An apparatus for automatically placing and routing comprising:
   a cell assigning section for automatically performing assignment of cells according to circuit data;
   a distribution path determining section for automatically determining a distribution path between the cells that have been assigned by said cell assigning section;
   a distribution information extracting section for extracting information regarding the distribution path that has been determined by said distribution path determining section;
   a prescribed-information recognizing section for recognizing information of a prescribed portion of the distribution according to information that has been extracted by said distribution information extracting section;
   an additional-distribution-data generating section for generating additional distribution data for correcting the width of distribution of the prescribed portion of the distribution that has been recognized by said prescribed-information recognizing section; and
   an additional-distribution-data lay-out section for laying out the additional distribution data that has been generated by said additional-distribution-data generating section with respect to the prescribed portion of the distribution.

2. The apparatus for automatically placing and routing according to claim 1, wherein the prescribed portion of the distribution is an end or a bend of the distribution.

3. The apparatus for automatically placing and routing according to claim 2, wherein said additional-distribution-data lay-out section imparts a layer number different from that of the prescribed portion of the distribution to the additional distribution data corresponding to the prescribed portion.

4. The apparatus for automatically placing and routing according to claim 2, wherein said additional-distribution-data generating section generates additional distribution data in such a way that a different size of additional distribution is laid out when the prescribed portion of the distribution is an end and when this prescribed portion is a bend.

5. A method of automatically placing and routing comprising:
   a cell assigning step of automatically performing assignment of cells according to circuit data;
   a distribution path determining step of automatically determining a distribution path between the cells that have been assigned in said cell assigning step;
   a distribution information extracting step of extracting information regarding the distribution path that has been determined in said distribution path determining step;
   a prescribed-information recognizing step of recognizing information of a prescribed portion of the distribution according to information that has been extracted in said distribution information extracting step;

an additional-distribution-data generating step of generating additional distribution data for correcting the width of distribution of the prescribed portion of the distribution that has been recognized in said prescribed-information recognizing step; and an additional-distribution-data lay-out step of laying out the additional distribution data that has been generated in said additional-distribution-data generating step with respect to the prescribed portion of the distribution.

6. The method of automatically placing and routing according to claim 5, wherein the prescribed portion of the distribution is an end or a bend of the distribution.

7. The method of automatically placing and routing according to claim 6, wherein said additional-distribution-data lay-out step imparts a layer number different from that of the prescribed portion of the distribution to additional distribution data corresponding to the prescribed portion.

8. The method of automatically placing and routing according to claim 6, wherein said additional-distribution-data generating step generates additional distribution data in such a way that a different size of additional distribution is laid out between when the prescribed portion of the distribution is an end and when this prescribed portion is a bend.

* * * * *